United States Patent
Wei et al.

(10) Patent No.: US 8,274,120 B2
(45) Date of Patent: Sep. 25, 2012

(54) TECHNIQUE FOR PROVIDING STRESS SOURCES IN TRANSISTORS IN CLOSE PROXIMITY TO A CHANNEL REGION BY RECESSING DRAIN AND SOURCE REGIONS

(75) Inventors: Andy Wei, Dresden (DE); Thorsten Kammler, Ottendorf-Okrilla (DE); Jan Hoentschel, Dresden (DE); Manfred Horstmann, Duerrrhoehrsdorf-Ditterbach (DE); Peter Javorka, Dresden (DE); Joe Bloomquist, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 83 days.

(21) Appl. No.: 12/710,744

(22) Filed: Feb. 23, 2010

(65) Prior Publication Data
US 2010/0155850 A1 Jun. 24, 2010

Related U.S. Application Data

(62) Division of application No. 11/558,006, filed on Nov. 9, 2006, now Pat. No. 7,696,052.

(30) Foreign Application Priority Data

Mar. 31, 2006 (DE) .......................... 10 2006 015 077

(51) Int. Cl.
*H01L 29/76* (2006.01)
*H01L 29/94* (2006.01)
(52) U.S. Cl. .......................... 257/382; 257/369; 257/408
(58) Field of Classification Search .................. 257/336, 257/338, 344, 369, 382–384, 408, E21.385, 257/E21.42, E21.43, E21.431, E29.193
See application file for complete search history.

(56) References Cited

U.S. PATENT DOCUMENTS

| | | | |
|---|---|---|---|
| 7,172,933 B2 | 2/2007 | Huang et al. ................... | 438/197 |
| 2005/0029601 A1 | 2/2005 | Chen et al. ..................... | 257/369 |
| 2005/0035470 A1 | 2/2005 | Ko et al. ........................ | 257/900 |
| 2005/0104057 A1 | 5/2005 | Shaheed et al. ................. | 257/29 |
| 2005/0110082 A1 | 5/2005 | Cheng et al. ................... | 257/341 |
| 2005/0269650 A1* | 12/2005 | Pidin .............................. | 257/411 |
| 2006/0065914 A1 | 3/2006 | Chen et al. ..................... | 257/288 |
| 2007/0132038 A1* | 6/2007 | Chong et al. ................... | 257/401 |

OTHER PUBLICATIONS

D. Widmann, et al. "Technologie hochintegrierter Schaltungen" Springer 1996.
Translation of Official Communication from German Patent Application No. 10 2006 015 077.5-33 dated Dec. 27, 2006.
PCT Search Report Dated Aug. 20, 2007 for serial No. PCT/US07/004689.

* cited by examiner

*Primary Examiner* — Hung Vu
(74) *Attorney, Agent, or Firm* — Williams, Morgan & Amerson, P.C.

(57) ABSTRACT

By recessing drain and source regions, a highly stressed layer, such as a contact etch stop layer, may be formed in the recess in order to enhance the strain generation in the adjacent channel region of a field effect transistor. Moreover, a strained semiconductor material may be positioned in close proximity to the channel region by reducing or avoiding undue relaxation effects of metal silicides, thereby also providing enhanced efficiency for the strain generation. In some aspects, both effects may be combined to obtain an even more efficient strain-inducing mechanism.

11 Claims, 10 Drawing Sheets

TECHNIQUE FOR PROVIDING STRESS SOURCES IN TRANSISTORS IN CLOSE PROXIMITY TO A CHANNEL REGION BY RECESSING DRAIN AND SOURCE REGIONS

CROSS-REFERENCE TO RELATED APPLICATION

This is a divisional of application Ser. No. 11/558,006, filed Nov. 9, 2006 now U.S. Pat. No. 7,696,052.

BACKGROUND OF THE INVENTION

1. Field of the Invention

Generally, the present invention relates to the formation of integrated circuits, and, more particularly, to the formation of transistors having strained channel regions by using stress sources, such embedded strained layers, stressed overlayers and the like, to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above-mentioned process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region increases the mobility of electrons, which in turn may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region. Hence, although providing significant advantages over the above-discussed approach requiring additional stress layers within the channel region, the efficiency of the stress transfer mechanism may depend on the process and device specifics and may result in a reduced performance gain for well-established standard transistor designs, since the overlaying layer may be significantly offset from the channel region, thereby reducing the strain finally created in the channel region.

In another approach, the hole mobility of PMOS transistors is enhanced by forming an embedded strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. Typically, the strained silicon/germanium is provided with a certain degree of "overfill" during the epitaxial growth in order to reduce the consumption of "precious" strained silicon/germanium material during a silicidation process for forming a metal silicide in the drain and source regions for obtaining a reduced contact resistance. However, this raising of the drain and source regions may reduce the efficiency of the stress transfer of any overlaying layers, if such layers are provided in combination with the embedded strain layer.

In view of the above-described situation, there exists a need for an improved technique that efficiently increases performance of MOS transistors by stress transfer mechanisms, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that provides enhanced transistor performance by significantly increasing the strain in the channel region by more efficiently transferring stress from one or more stress sources into the channel region. For this purpose, a stressed dielectric layer may be positioned more closely to the channel region in order to significantly enhance the stress transfer. In some illustrative embodiments of the present invention, the stress transfer mechanism, for instance obtained on the basis of an overlying dielectric stressed layer, may be significantly increased by recessing the respective drain and source regions in order to form the stressed dielectric layer at a lower depth relative to the gate insulation layer, thereby significantly enhancing the stress transfer, since the stressed dielectric layer may now transfer the respective stress more directly to the channel region. The recessed drain and source regions may, in some embodiments, also comprise a strained semiconductor material to enhance even more the resulting strain in the channel region.

In another illustrative embodiment of the present invention, a semiconductor device comprises a first transistor of a first conductivity type comprising a first gate electrode formed above a first channel region and a first gate insulation layer formed between the first gate electrode and the first channel region. Furthermore, the first transistor comprises first drain and source regions formed adjacent to the first channel region, wherein the first drain and source regions are recessed with respect to the first gate insulation layer. Finally, the first transistor comprises a first stressed layer formed above the first drain and source regions, wherein the first stress layer extends into a recess formed by the recessed first drain and source regions.

According to yet another illustrative embodiment of the present invention, a semiconductor device comprises a buried insulating layer formed above a substrate and a semiconductor layer formed on the buried insulating layer. The semiconductor device further comprises a gate electrode formed above the semiconductor layer and separated therefrom by a gate insulation layer. A strained semiconductor material is formed in the semiconductor layer, wherein the strained semiconductor material extends above the gate insulation layer. A drain region and a source region are formed partially within the strained semiconductor material and a sidewall spacer is formed at a sidewall of the gate electrode and above the strained semiconductor material. Finally, the semiconductor device further comprises a metal silicide region formed in the drain and source regions adjacent to the sidewall spacer.

According to still another illustrative embodiment of the present invention, a method comprises forming a recess adjacent to a gate electrode structure in a semiconductor layer, wherein the gate electrode structure comprises a first sidewall spacer having a first width. Moreover, a strained semiconductor material is formed in the recess, and drain and source regions are formed at least in the strained semiconductor material on the basis of a second sidewall spacer having a second width greater than the first width.

According to a further illustrative embodiment of the present invention, a method comprises forming a first recess adjacent to a gate electrode of a first field effect transistor, wherein the gate electrode is located above a semiconductor layer and has formed on sidewalls thereof a sidewall spacer. Moreover, the method comprises forming a drain region and a source region adjacent to the sidewall spacer. Finally, the method comprises forming a first dielectric stressed layer above the first field effect transistor, wherein the first dielectric stressed layer is formed in the recess so as to extend below a gate insulation layer located between the gate electrode and the semiconductor layer.

BRIEF DESCRIPTION OF THE DRAWINGS

The invention may be understood by reference to the following description taken in conjunction with the accompanying drawings, in which like reference numerals identify like elements, and in which.

Figure 1A:
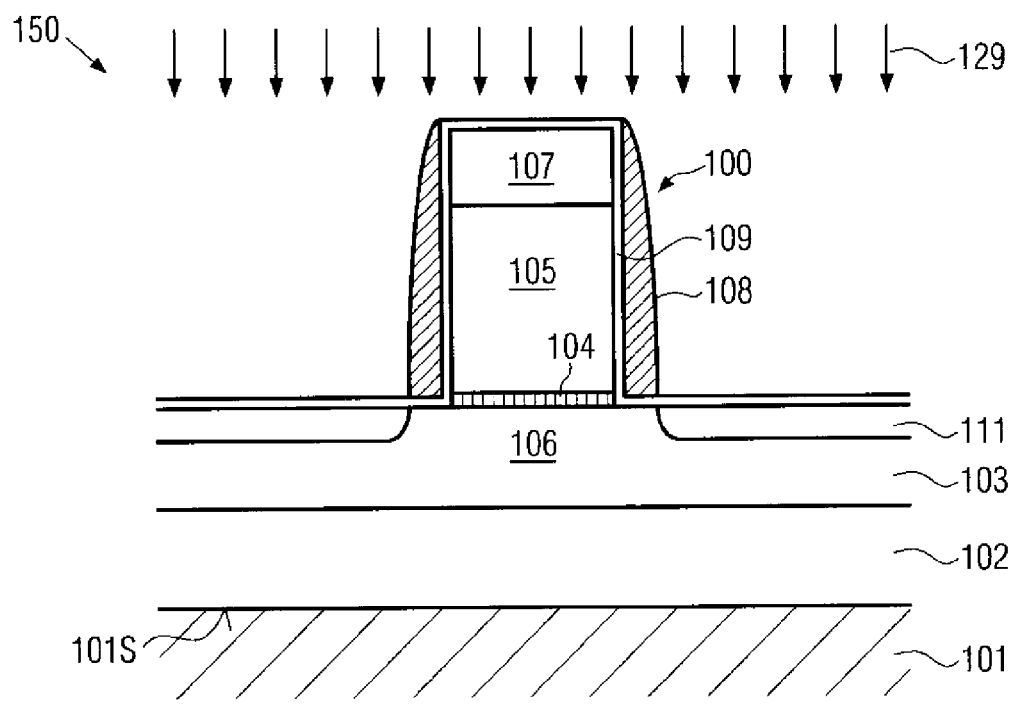
FIGS. 1a-1e schematically show cross-sectional views of a transistor during various manufacturing stages in forming recessed drain and source regions for receiving a recessed stressed layer according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to a technique for enhancing the stress transfer into the channel region of respective transistors by increasing the efficiency of stress transfer of an overlaying material layer, such as a contact etch stop layer and/or of a strained semiconductor material formed in the drain and source regions of the respective transistors. For example, with respect to the former aspect, i.e., the enhancement of the stress transfer mechanism by using a stressed overlaying layer, such as a contact etch stop layer, it is contemplated by the present invention that stress transfer may be significantly enhanced by using a different transistor architecture compared to conventional approaches. For instance, in a typically standard transistor configuration, in which the drain and source regions are substantially flush with a channel region, i.e., the interface between the gate insulation layer and the underlying crystalline semiconductor region, a stress transfer and thus strain generation in the channel region may be achieved by the contact etch stop layer, which is typically provided above the transistor with high tensile or compressive stress, wherein the respective stress is transferred into the channel region through sidewall spacers of the gate electrode. In other conventional approaches, raised drain and source regions are frequently provided, for instance in order to reduce the drain and source resistance by providing an enhanced depth of metal silicide, or in order to accommodate a strained semiconductor material, such as silicon/germanium, which may then be provided in excess in order to reduce the consumption of strained semiconductor material during the metal silicide formation at a height that substantially corresponds to the channel region. In these approaches, stress created by the overlaying contact etch stop layer is transferred via the upper portion of the spacers, due to the raised drain and source regions, thereby requiring the stress to act through an increased amount of material, thereby significantly reducing the finally obtained strain in the channel region.

According to one aspect of the present invention, the stress transfer into the channel region created by an overlaying stressed layer, such as a contact etch stop layer, may be significantly enhanced by recessing the drain and source regions, since in this case the mechanisms of a substantially flush and a raised drain and source architecture are still effective, while additionally a high "direct" component of the stress is obtained, since components of the overlaying stressed layer located a height level below the gate insulation layer may laterally "push" on the channel region and thus effectively generate strain in the neighboring channel region. Moreover, in some illustrative embodiments of the present invention, the strain transfer obtained by strained semiconductor material in the drain and source regions may be enhanced in efficiency by more closely positioning the strained material to the channel region wherein, in some illustrative embodiments, this technique may be combined with the above-described technique using a recessed stressed overlayer. This may be accomplished by means of "disposable" spacers, wherein first spacers may be used for defining a cavity next to the channel regions, and subsequently, after removal of these spacers, the actual device spacers may be formed with increased width so that, after the formation of metal silicide in the strained semiconductor material on the basis of the device spacer, a portion of the strained semiconductor material laterally remains between the metal silicide and the channel region. Thus, the disposable spacer approach enables an efficient combination with the approach of the recessed stressed overlayer, since the offset provided by the disposable spacer approach provides strained semiconductor material close to the channel region, which is even maintained after silicidation, while the recessed stress layer may act more directly, as is explained above. As will be described later on in more detail, the various aspects for enhancing the stress transfer mechanism may be appropriately combined and may also be used to produce different types of strain in the respective channel regions, thereby providing the potential for individually enhancing the performance of N-channel transistors and P-channel transistors, wherein also in some aspects an enhanced stress transfer mechanism is provided for SOI-like transistor architectures, even though a stress transfer by a strained semiconductor material is restricted to the available thickness of the corresponding active semiconductor layer, contrary to bulk devices, in which strained semiconductor material may be provided down to a significant depth of the drain and source regions.

With reference to FIGS. 1a-1i and 2a-2h, further illustrative embodiments of the present invention will now be described in more detail. FIG. 1a schematically illustrates a cross-sectional view of a semiconductor device 150 comprising a transistor element 100. The transistor 100 may represent a field effect transistor of a specific conductivity type, such as a P-channel transistor or an N-channel transistor. The transistor 100 may, in some illustrative embodiments, be formed above a substrate 101, which may represent any appropriate substrate, such as a bulk silicon substrate, a silicon-on-insulator (SOI) substrate or any other appropriate carrier material. In the embodiment shown, the transistor 100 may represent an SOI-like transistor and thus the substrate 101 may have formed thereon a buried insulating layer 102, which may be comprised of any appropriate insulating material, such as silicon dioxide, silicon nitride and the like. A semiconductor layer 103 is formed above the substrate 101 and may be comprised of a substantially crystalline semiconductor material, wherein, in some illustrative embodiments, the semiconductor layer 103 may comprise a significant amount of silicon, as the vast majority of complex integrated circuits are currently manufactured from silicon-based semiconductor material. It should be appreciated, however, that the principles of the present invention may also be applied to any other appropriate semiconductor material in which a generation of strain may significantly affect the device performance of the transistor 100. The transistor 100 may further comprise a gate electrode 105, which may be comprised in this manufacturing stage of any appropriate material, such as polysilicon and the like, wherein it should be appreciated that, according to other process strategies, the gate electrode 105 may represent a material that may be converted into a conductive material of enhanced conductivity at a later stage, at least partially, or which may represent a place holder material that may be substantially completely replaced by other conductive materials, such as metals, metal compounds and the like, in a later stage. The gate electrode 105 is separated from the semiconductor layer 103 by a gate insulation layer 104, thereby defining a channel region 106 located below the gate insulation layer 104.

It is to be noted that in the specification and the claims any position information is to be regarded as "relative" position information and is to be considered with respect to a reference position, such as the surface 101S of the substrate 101, wherein an "upwards" direction is determined by the transistor 100 so that the buried layer 102 is formed "above" the substrate 101, while the transistor 100 is formed "above" the buried layer 102. Similarly, the gate insulation layer 104 is located "under" or "below" the gate electrode 105, and the channel region 106 is located below the gate electrode 105 and the gate insulation layer 104. Moreover, a lateral direction is to be considered as a direction substantially parallel to the surface 101S. Similarly, a horizontal direction is also to be considered as a direction substantially parallel to the surface 101S, while a vertical direction substantially corresponds to a direction perpendicular to the surface 101S.

In this manufacturing stage, the gate electrode 105 of the transistor 100 may, in some illustrative embodiments, be encapsulated by a capping layer 107, which may be formed of silicon dioxide, silicon nitride, or any other appropriate material, and corresponding sidewall spacers 108, for instance in combination with an appropriate liner material 109, formed at sidewalls of the gate electrode 105. For example, the sidewall spacers 108 may be comprised of any appropriate dielectric material, such as silicon nitride, silicon dioxide, silicon oxynitride and the like. Moreover, located within the semiconductor layer 103 adjacent to the channel region 106, a highly doped region, also referred to as extension region 111, may be formed with a lateral offset from the gate electrode 105 that is determined by the sidewall spacers 108. The extension regions 111 may be formed by any appropriate dopant material, such as a P-type dopant or an N-type dopant, depending on the conductivity type of the transistor 100.

A typical process flow for forming the semiconductor device 150 as shown in FIG. 1a may comprise the following processes. After forming the semiconductor layer 103, for instance by providing an appropriate SOI-like substrate, or by epitaxial growth techniques, when the substrate 101 is a semiconductor bulk substrate without the buried layer 102, respective implantation processes may be performed in order to obtain a desired vertical dopant profile (not shown) within the semiconductor layer 103. Thereafter, a dielectric layer may be formed, for instance by oxidation and/or deposition on the basis of well-established techniques, followed by the deposition of a gate electrode material by well-established deposition techniques, such as low pressure chemical vapor deposition (LPCVD) when, for instance, polysilicon is considered.

Next, the gate electrode material and the dielectric layer may be patterned on the basis of sophisticated photolithography and etch techniques in order to obtain the gate electrode 105 and the gate insulation layer 104. It should be appreciated that, in some illustrative embodiments, the gate electrode material may be provided with a respective capping layer, which may also be patterned in combination with the gate electrode material, thereby forming the capping layer 107.

Thereafter, the sidewall spacers 108 may be formed by depositing the liner material 109, if provided, and subsequently forming a spacer layer, such as a silicon nitride layer, a silicon dioxide layer and the like, wherein a high degree of etch selectivity may be provided between the liner 109 and the spacer layer in order to efficiently control a subsequent anisotropic etch process for removing the spacer layer material from horizontal portions of the device 150, thereby leaving the spacers 108. A thickness of the spacer layer and thus a width of the spacers 108 is selected in accordance with device requirements so as to obtain a desired offset of the extension regions 111 from the gate electrode 105 during a subsequent ion implantation process 129 for introducing a desired dopant species with a specific concentration at a specified depth of the semiconductor layer 103. Depending on process strategy, an anneal process may be performed after the ion implantation 129 in order to activate the dopants in the regions 111, while, in other strategies, a corresponding anneal process may be performed at a later manufacturing stage.

Next, in one illustrative embodiment, a further spacer layer may be formed above the device 150 on the basis of well-established techniques, such as plasma enhanced chemical vapor deposition (PECVD), wherein the further spacer layer may be comprised of substantially the same material as the spacers 108 or may be comprised of a material having a high etch selectivity with respect to the spacers 108. For example, silicon nitride or silicon dioxide may be deposited in a substantially conformal manner with a specified layer thickness and thereafter an anisotropic etch process may be performed to remove the further spacer material from horizontal portions of the device 150.

Figure 1B:
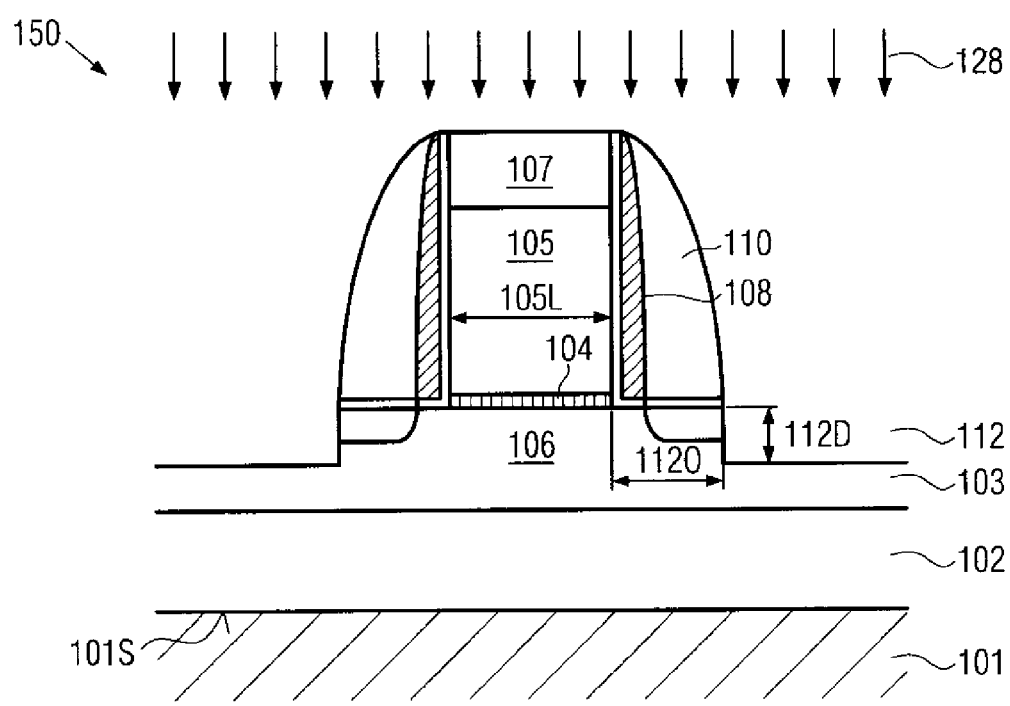

FIG. 1b schematically illustrates the semiconductor device 150 after the completion of the above-described process sequence and during an etch process 128. Hence, the transistor 100 of the device 150 comprises a further spacer element 110, which may be formed directly on the spacer 108, or which may comprise a further liner (not shown), depending on the process requirements. The spacer 110 is comprised of an appropriate material that has a high etch selectivity with respect to the material of the semiconductor layer 103 during the etch process 128, which may, in some embodiments, be designed as a substantially anisotropic etch process, while, in other illustrative embodiments, the etch process 128 may be performed with a reduced degree of anisotropy or as a highly isotropic etch process. For example, efficient etch recipes for etching a silicon-based material with high selectivity to, for instance, silicon dioxide, silicon nitride and the like are well established in the art. During the etch process 128, a recess 112 may be formed, wherein the lateral offset 112O of the recess 112 with respect to the gate electrode 105 is determined by the width of the spacers 108 and 110 and the specifics of the etch process 128. In the example shown in FIG. 1*b*, the etch process 128 is assumed to be highly anisotropic, while in other cases a certain degree of under-etching may be achieved. The recess 112 may be formed down to a depth 112D that ensures a highly efficient stress transfer into the channel region 106 after the recess 112 is filled by a highly stressed overlaying material. The depth 112D may be obtained on the basis of an appropriately selected target value in combination with a corresponding control of the etch time of the process 128. For example, in illustrative embodiments in which a gate length of the transistor 100, i.e., in FIG. 1*b* the horizontal extension of the gate electrode 105, indicated as 105L, is approximately 100 nm and significantly less, or even 50 nm and less, the depth 112D may range from approximately 1-20 nm. The offset 112O of the recess 112 may also range from approximately several nanometers to ten or more nanometers, depending on the specifics of the etch process 128 and the width of the spacers 110 and 108, which may range from approximately 5-20 nm for gate lengths in the above-specified range.

Figure 1C:
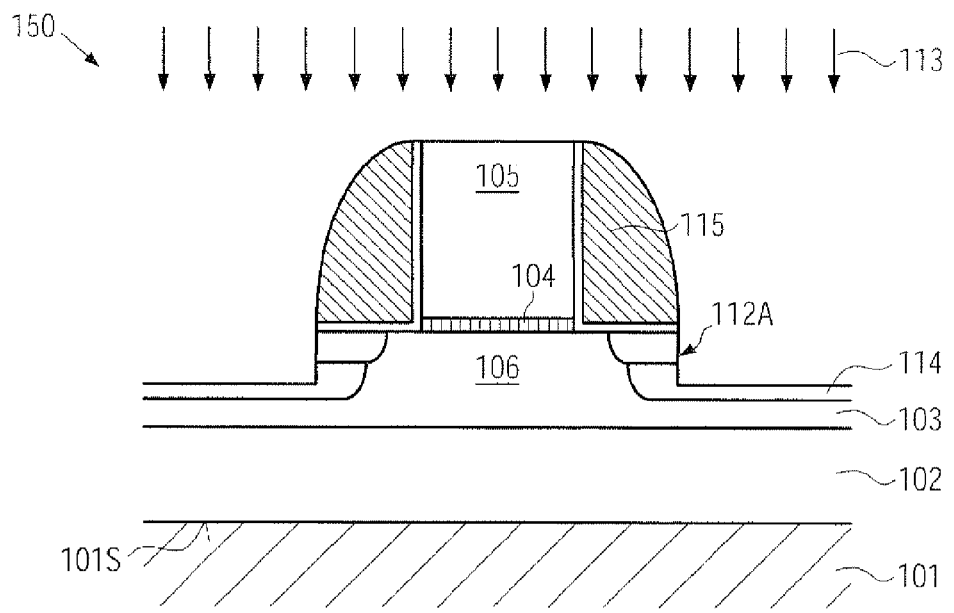

FIG. 1*c* schematically shows the semiconductor device 150 in a further advanced manufacturing stage, in which the device 150 is subjected to a further implantation process 113 for defining drain and source regions 114 adjacent to the recess 112. During the ion implantation process 113, which may be performed on the basis of appropriately selected process parameters with respect to implantation energy and implantation dose, the gate electrode 105 may also be exposed, depending on process strategies. For example, the capping layer 107 may be removed on the basis of a selective etch process, wherein, in some illustrative embodiments, the spacers 108 and 110 may also be removed if the capping layer 107 and the spacers 108, 110 are substantially comprised of the same material, such as silicon nitride and the like. In this case, corresponding new spacers 115 may be formed on the basis of well-established recipes so as to act as implantation masks during the process 113. In other process strategies, at least the spacer 110 may be comprised of a material having a high etch selectivity with respect to the capping layer 107, for instance the spacer 110 may be comprised of silicon dioxide and the capping layer 107 may be comprised of silicon nitride, or vice versa, thereby substantially maintaining the spacers 110 and 108 so that the ion implantation process 113 may be performed on the basis of the spacers 110 and 108. It should be appreciated that further implantation processes, such as a halo implantation, an amorphization implantation and the like, may be performed prior to or after the actual implantation 113 for forming the drain and source regions 114, depending on the process strategy. Moreover, it should be appreciated that any of these implantation processes, including the implantation 113, may comprise a tilted implantation process in order to appropriately position the respective dopant species at a sidewall 112A of the recess 112. Consequently, on the basis of appropriately selected process parameters with respect to implantation dose, implantation energy and tilt angle, i.e., an angle with respect to the vertical direction, which may be obtained on the basis of well-established simulation models, a desired lateral and vertical dopant profile for the drain and source regions 114 may be achieved. Thereafter, an anneal process may be performed to activate the introduced dopant species as well as to, at least partially, re-crystallize implantation-induced damage in the drain and source regions 114.

Figure 1D:
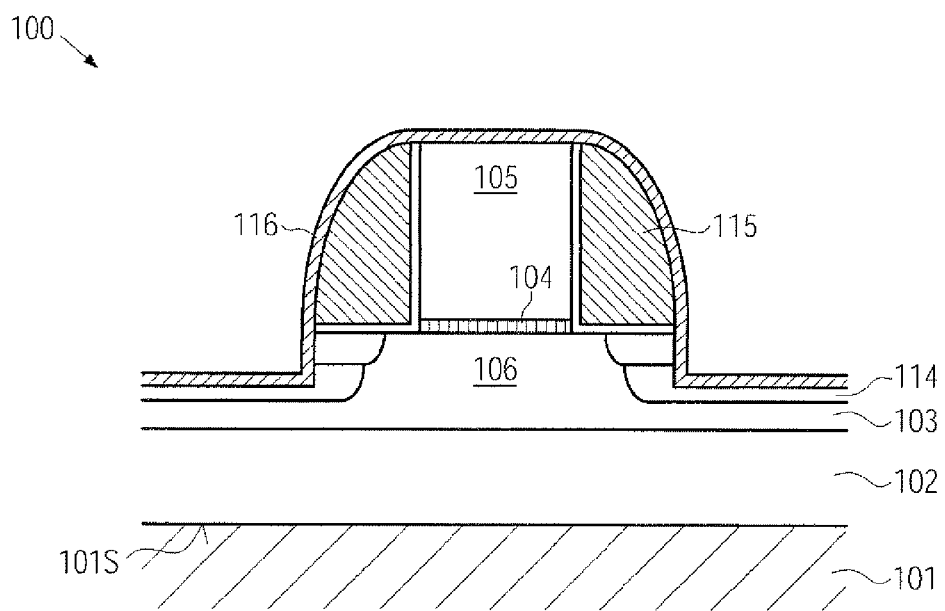

FIG. 1*d* schematically illustrates the semiconductor device 150 in a further advanced manufacturing stage, after the completion of the above-described process sequence and with a layer of refractory metal 116 formed above the transistor 100. The layer 116 may be comprised of one or more metals, such as nickel, platinum, cobalt, combinations thereof and the like, which may be formed on the basis of well-established techniques, such as sputter deposition or any other appropriate deposition technique, with any preceding cleaning recipes including plasma-based cleaning processes and/or thermally activated cleaning processes. Thereafter, an appropriate sequence of heat treatments may be performed to initiate a chemical reaction of the metal layer 116 with underlying semiconductor material, which may be provided in the gate electrode 105 and the drain and source regions 114, thereby converting the semiconductor material, such as silicon, silicon/germanium, silicon/carbon and the like, into a highly conductive semiconductor metal compound, such as a metal silicide. After the chemical reaction and the removal of any excess material which may remain on dielectric portions, such as the spacers 115, further processing may be continued with the formation of stressed contact etch stop layers.

Figure 1E:
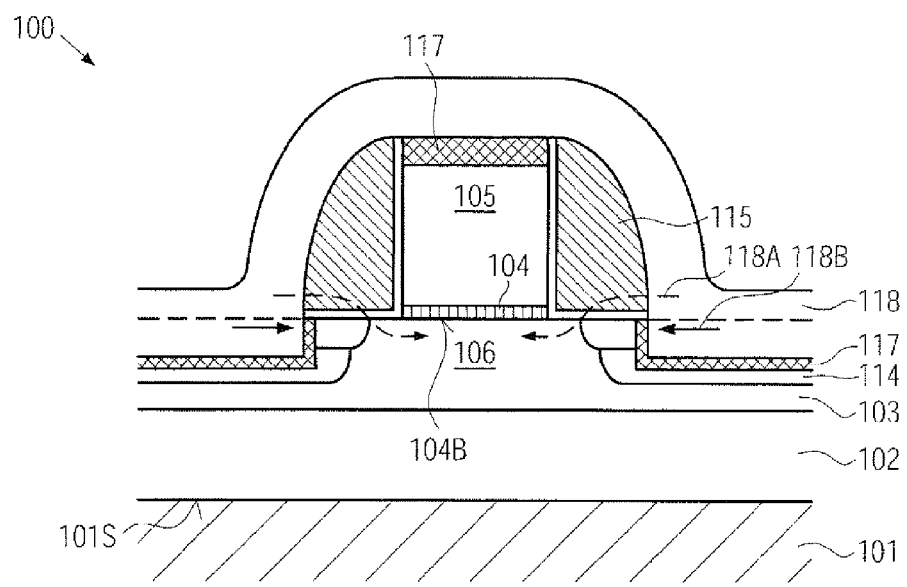

FIG. 1*e* schematically illustrates the semiconductor device 150, in which the transistor element 100 comprises metal silicide regions 117 formed in the drain and source regions 114 as well as in the gate electrode 105, wherein it should be appreciated that, in other process strategies, the metal silicide regions 117 may not necessarily be formed in a common process or may not be formed at all, as will be described later on. Moreover, a stressed contact etch stop layer 118 is formed above the transistor 100 such that the stressed layer 118 is also formed within the recesses 112, that is, the stressed layer 118 extends below a bottom surface 104B of the gate insulation layer 104. As is well known, a plurality of dielectric materials, such as silicon nitride, may be deposited so as to exhibit a specific magnitude and type of intrinsic stress, wherein the type and magnitude of intrinsic stress may be controlled on the basis of deposition parameters. For instance, silicon nitride may be highly efficiently deposited on the basis of plasma-enhanced deposition techniques so as to exhibit a high magnitude of intrinsic stress ranging, for instance, from tensile stress of 1.5 GPa (GigaPascal) or more to compressive stress of substantially the same order of magnitude by appropriately adjusting process parameters, such as deposition temperature, deposition pressure, ratio of precursor materials, ion bombardment during the deposition and the like. Consequently, based on the conductivity type and the desired magnitude of strain in the channel region 106, the layer 118 may be provided with the respective internal stress. For instance, if the transistor 100 is to represent a P-channel transistor, wherein a compressive strain in the channel region 106 may increase the hole mobility and thus the drive current capability of the transistor 100, the contact etch stop layer 118 may be provided with compressive stress, which creates a corresponding compressive strain in the channel region 106. As indicated by arrows 118A, the stressed layer 118 may provide a certain degree of strain into the channel region 106 in a similar way as in transistor architectures having substantially flush drain and source regions, wherein, however, in this case, additionally stress is transferred highly efficiently into the channel region 106 due to the fact that the layer 118 is positioned at a height that approximately corresponds to the position of the channel region 106. Consequently, a corresponding stress indicated by the arrows 118B may highly efficiently act laterally in a "direct" manner on the channel region 106, thereby creating additional strain therein. Hence, a high degree of strain in the channel region 106 may be created even without a strained semiconductor material, as is frequently used in other transistor configurations, as will be described later on, thereby reducing production costs since corresponding epitaxial growth processes may be omitted.

By providing the layer 118 with any desired type of stress, the desired type of strain may be created in the channel region 106. For example, if the transistor 100 may represent an N-channel transistor requiring a tensile stress for increasing the electron mobility in the channel region 106, the layer 118 may be formed with high tensile stress on the basis of appropriately selected deposition parameters, as explained above. Moreover, different types of transistors may receive the layer 118 with a different stress, as will be described later on in more detail, thereby providing a high degree of design flexibility. Furthermore, the contact etch stop layer 118 may be formed directly on the respective drain and source regions, i.e., in the example shown in FIG. 1*a* directly on the respective metal silicide regions 117, while, in other approaches, an intermediate liner (not shown) may be deposited, wherein an intermediate liner, which may be used as an etch stop layer for removing unwanted portions of the layer 118 from respective device areas, as will be described later on, may not necessarily negatively impact the strain transfer mechanism since the stress 118B may nevertheless substantially directly act on the channel region 106, even if a thin intermediate layer is provided.

Figure 1F:
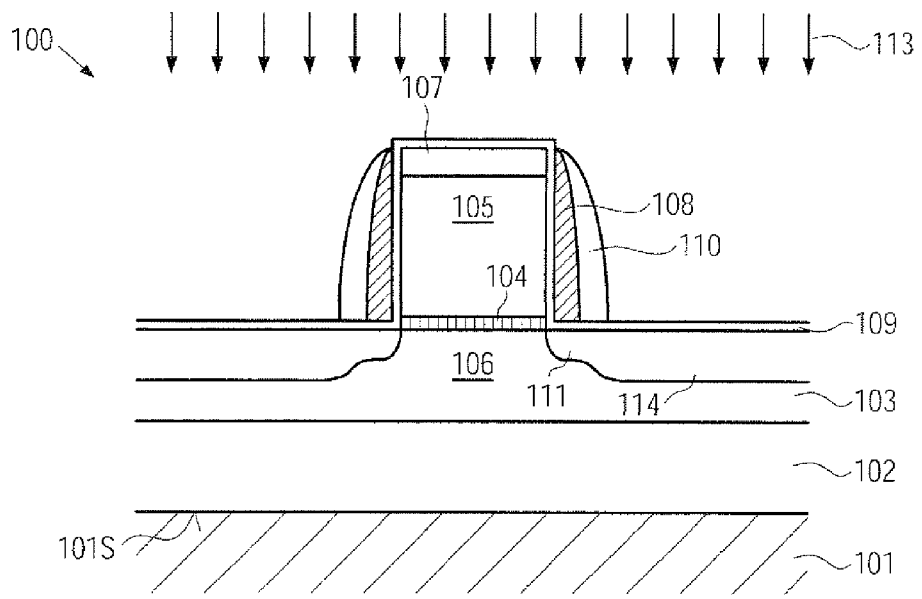
FIGS. 1f-1g schematically illustrate cross-sectional views of a transistor during the formation of recessed drain and source regions, in which the etch process for recessing the drain and source regions is performed after ion implantation in accordance with yet other illustrative embodiments.

FIG. 1*f* schematically illustrates the semiconductor device 150 according to still further illustrative embodiments, in which the drain and source regions 114, as well as the extension regions 111, may be formed by the ion implantation 113 prior to the formation of the recesses 112. For example, the transistor 100 may have the gate electrode 105 encapsulated by the capping layer 107 and the corresponding spacers 108 and 110, wherein the spacers 108 may provide the desired offset of the extension regions 111 with respect to the gate electrode 105, while the spacers 110 may provide the desired offset of the drain and source regions 114, as is also described above. During the ion implantation 113, the respective process parameters may be selected such that the drain and source regions 114 are designed in conformity with the recess 112 that is to be formed in a subsequent manufacturing step. That is, during the implantation 113, and also during any associated implantation processes for halo implants and amorphization, the process parameters, such as implantation dose, implantation energy and possibly tilt angle, may be selected such that the drain and source regions 114 receive a desired dopant concentration and gradient at the PN junction, as is also described with respect to FIG. 1*c*, so that the drain and source regions 114 may be appropriately recessed while nevertheless maintaining the required functionality of the regions 114.

Figure 1G:
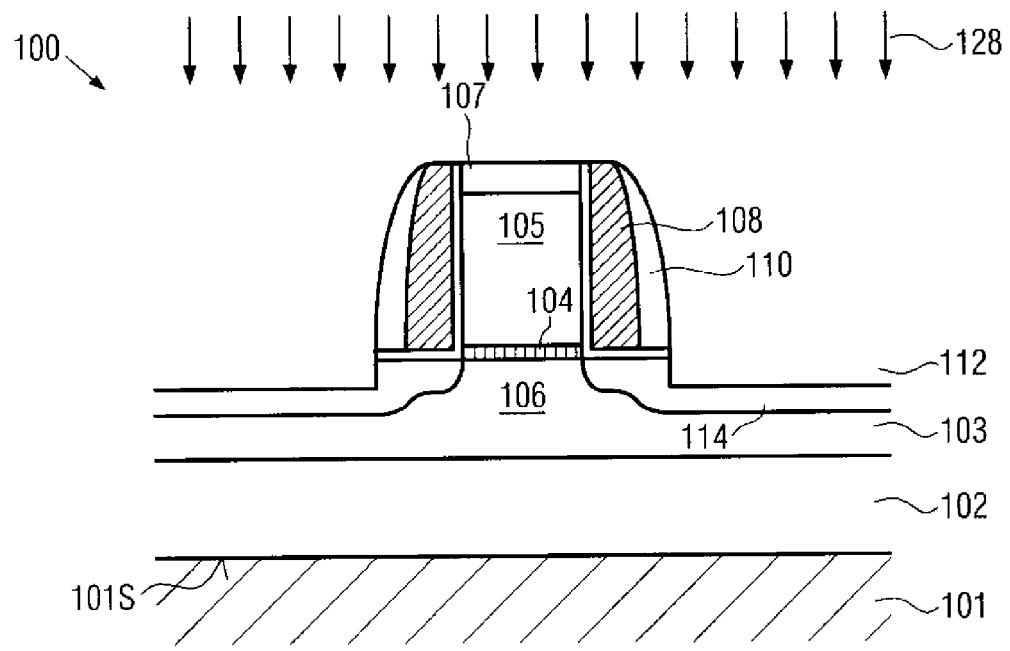

FIG. 1*g* schematically illustrates the device 150 after the ion implantation 113, wherein, in some illustrative embodiments, the etch process 128, which may be an anisotropic process or an isotropic process as is previously described, may be performed prior to performing an appropriate anneal process for activating the dopants in the regions 114. Consequently, during the etch process 128, an increased etch rate may be obtained, due to the preceding implantation processes, which may substantially affect the crystalline structure and thus the etch rate during the process 128. In this way, the etch selectivity with respect to the spacers 110 and the capping layer 107 may be increased, since the ion bombardment during the preceding implantation processes may modify the semiconductor layer 103 more efficiently compared to the dielectric materials of the spacers 110 and the capping layer 107. In other illustrative embodiments, the etch process 128 may be performed after any anneal cycles for activating the dopant species and for re-crystallizing implantation-induced damage. During the etch process 128, the recesses 112 are formed within the drain and source regions 114, wherein, with respect to the depth of the recess 112 as well as with respect to its lateral offset with respect to the gate electrode 105, the same criteria apply as previously described. Thereafter, further processing may be continued as is also described with reference to FIGS. 1*d*-1*e*.

It should be appreciated that, in other illustrative embodiments (not shown), the capping layer 107 may not necessarily be provided prior to the etch process 128 so that, during the corresponding process, the gate electrode 105, when comprised of polysilicon, may also be recessed, wherein a corresponding material removal of the gate electrode 105 may be taken into consideration during the formation of the gate electrode 105. That is, the gate electrode material may be provided with a certain extra thickness that substantially corresponds to the depth 112D (FIG. 1*b*) of the recess 112, wherein, additionally, the difference in etch rate may be taken into consideration, when, for instance, the etch process 128 is performed on the basis of a substantially crystalline material in the semiconductor layer 103, while the silicon of the gate electrode 105 may be substantially a polycrystalline material.

As previously described, it may be advantageous to provide a highly conductive metal silicide in the drain and source regions and/or the gate electrode for a substantially silicon-based semiconductor device 150. When the respective metal silicide regions, such as the regions 117 (FIG. 1*e*), are formed commonly for the gate electrode 105 and the drain and source regions 114, a thickness of the metal silicide in the gate electrode 105 is substantially determined by the device constraints imposed by the characteristics of the respective drain and source regions 114, since, in these regions, the metal silicide may not be formed with a thickness as would be desirable for the gate electrode 105 in order to appropriately enhance the conductivity thereof. Consequently, in some illustrative embodiments, the formation of respective metal silicide regions in the drain and source regions 114 and the gate electrode 105 may be efficiently formed independently from each other.

Figure 1H:
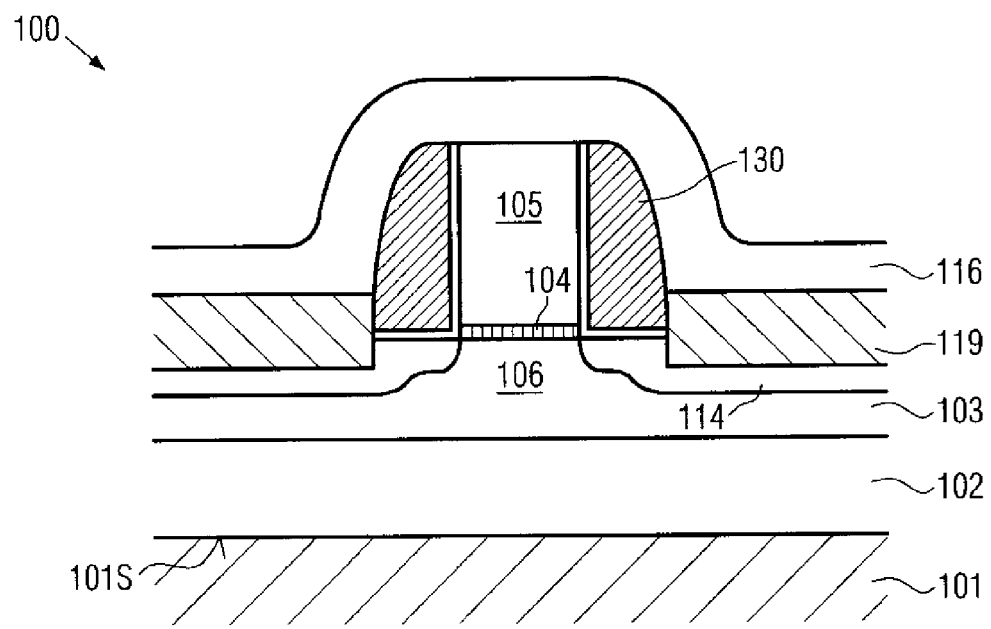
FIG. 1h schematically illustrates a cross-sectional view of a transistor during the formation of metal silicides in the drain and source regions and the gate electrode in a highly decoupled fashion according to yet other illustrative embodiments.

FIG. 1*h* schematically illustrates the semiconductor device 150 in accordance with one illustrative embodiment, in which the formation of respective metal silicide regions may be accomplished in a highly independent fashion. The device 150 may, in this manufacturing stage, i.e., after the formation of the recessed drain and source regions 114, comprise the layer 116 of refractory metal, wherein, additionally, a silicidation mask 119 is formed so as to cover the drain and source regions 114 while exposing at least a top surface of the gate electrode 105. For exposing the gate electrode 105, the capping layer 107, possibly in combination with the spacers 110 and 108, may be removed and may be replaced by spacers 130. In other cases, the gate electrode 105 may have been formed without the capping layer 107, as previously described. For example, the silicidation mask 119 may be comprised of any appropriate material, such as a polymer material, that may withstand the temperatures required for depositing the layer 116 and initiating a chemical reaction with material of the gate electrode 105. The silicidation mask 119 may be formed by depositing an appropriate material, such as a polymer, a photoresist or any other dielectric material, in a highly non-conformal fashion, for instance by any deposition technique providing a substantially flow-like fill behavior, such as spin-on techniques, when low viscous materials are considered and the like. If the material of the silicidation mask 119 is provided in excess so as to also cover the gate electrodes 105, a subsequent removal process, for instance by etching the material selectively to the gate electrode 105, may be performed in order to obtain a level for the silicidation mask 119 that at least exposes the top surface of the gate electrode 105.

After appropriate cleaning processes for removing any contaminants from the exposed gate electrode 105, the layer 116 may be deposited on the basis of any appropriate deposition techniques as explained above. Hereby, a thickness of the layer 116 and the material composition thereof may be selected with respect to requirements for the gate electrode 105 in order to obtain a required amount and type of metal silicide in the gate electrode 105. Thereafter, the chemical reaction may be initiated on the basis of an appropriate heat treatment to obtain the desired amount of highly conductive metal silicide in the gate electrode 105. It should be appreciated that other silicidation regimes may be used in which, for instance, a silicidation of the gate electrode material may be accomplished during deposition and simultaneous conversion of an appropriate metal into metal silicide. Thereafter, any excess material may be removed and thereafter, or within the same process sequence, the silicidation mask 119 may also be removed, for instance by any appropriate etch technique. For example, wellestablished etch techniques which may have a high degree of selectivity with respect to metal silicide and other materials, such as the material of the spacers 110 and the drain and source regions 114, are well-established and may be used during this process sequence.

Next, an appropriate silicidation process may be performed for the drain and source regions 114, wherein the respective process parameters may be selected such that an appropriate type and thickness of metal silicide is obtained in the drain and source regions 114. In this case, the further silicidation process may have only a minor effect on the previously formed metal silicide in the gate electrode 105. Thereafter, further processing may be continued as is also described with reference to FIG. 1e.

Figure 1I:
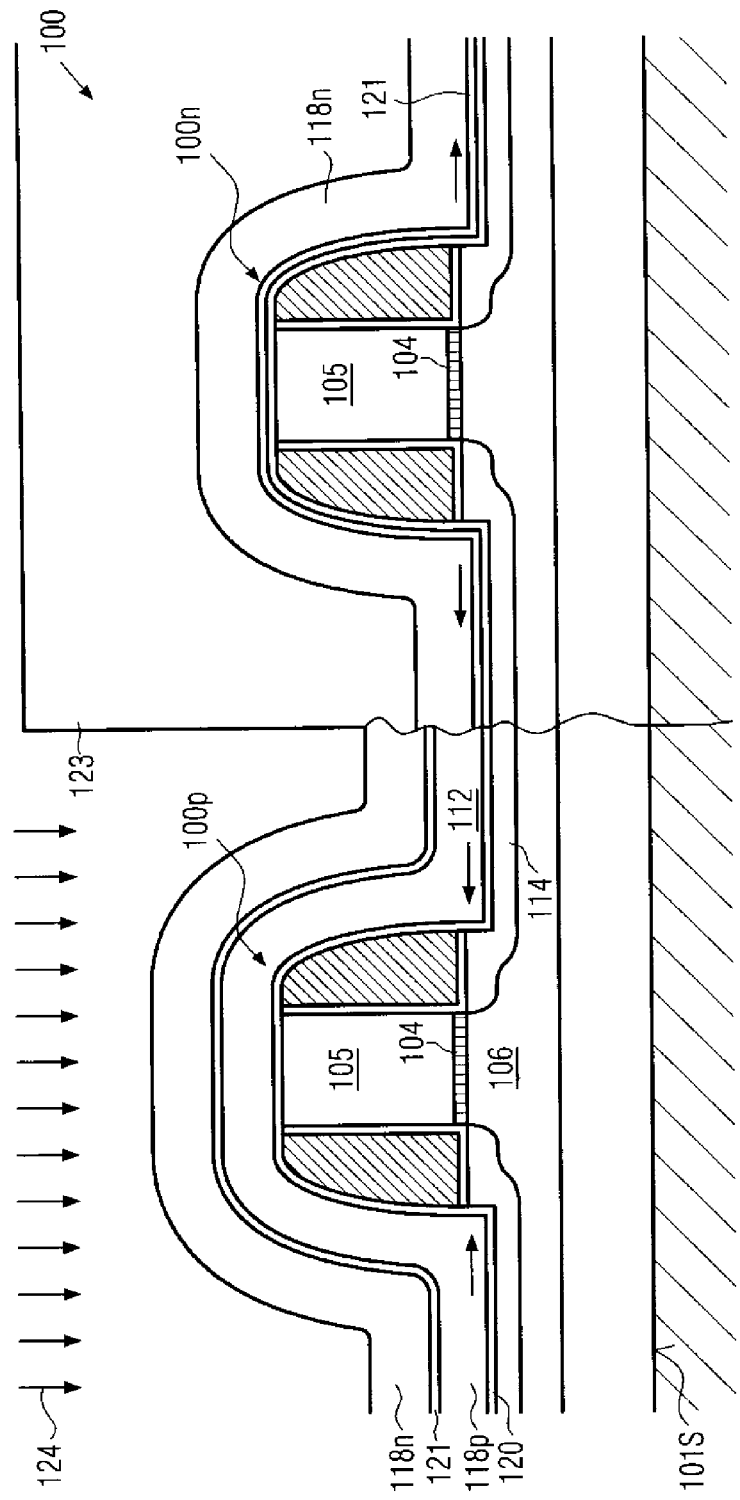
FIG. 1i schematically illustrates a cross-sectional view of a semiconductor device including two different types of transistors receiving differently stressed overlaying layers in accordance with other illustrative embodiments of the present invention.

FIG. 1i schematically illustrates the semiconductor device 150 comprising a first transistor 100p and a second transistor 100n, which may represent transistors of different conductivity types, such as a P-channel transistor and an N-channel transistor. The transistors 100p, 100n may have substantially the same configuration as the transistor element 100 previously described, wherein, however, the respective drain and source regions, as well as the corresponding channel regions, may have appropriate dopant species in order to provide the desired conductivity type. The transistors 100p, 100n may be formed on the basis of the process techniques described above with reference to transistor 100, wherein, however, the various implantation processes may be performed on the basis of respective implantation masks in order to selectively introduce the required dopant species into the transistors 100p, 100n on the basis of well-established masking techniques. Moreover, in both transistors 100p, 100n, the respective recesses 112 may be formed according to similar process techniques as previously described and the further processing, for instance the formation of metal silicide regions (not shown), may be accomplished as is previously described.

Thereafter, a first contact etch stop layer 118p may be formed above the first and second transistors 100p, 100n, wherein, in some illustrative embodiments, an optional etch stop layer 120 may be provided. For example, the optional etch stop layer 120 may be comprised of silicon dioxide, when the first contact etch stop layer 118p may be comprised of silicon nitride. In other illustrative embodiments, the etch stop layer 120 may be omitted. Thereafter, the first contact etch stop layer 118p may be removed from the transistor 100n, for example based on the etch stop layer 120, if provided, and a second contact etch stop layer 118n, possibly in combination with a second etch stop layer 121, may be formed so as to cover the second transistor 100n. For example, the first contact etch stop layer 118p may have a high intrinsic compressive stress when the transistor 100p represents a P-channel transistor, while the second contact etch stop layer 118n may comprise a high tensile stress when the transistor 100n represents an N-channel transistor. Furthermore, an appropriate etch mask, such as a resist mask 123, may be formed to expose the transistor 100p in order to remove the second contact etch stop layer 118n by means of a corresponding etch process 124, which may be controlled on the basis of the etch stop layer 121, if provided.

Consequently, after the removal of the unwanted portion of the layer 118n above the first transistor 100p, both transistors have formed thereon appropriately stressed contact etch stop layers, that is, the transistor 100p may have formed thereabove the layer 118p creating in a highly efficient manner a respective strain, wherein the transistor 100n comprises the layer 118n having a different type of intrinsic stress so as to create in the respective channel region a different desired type of strain. It should be appreciated that other regimes for forming differently stressed layers above the transistors 100p, 100n may be used, such as a selective stress relaxation of a portion of the layers 118p or 118n, or, in other regimes, the corresponding layers 118p and 118n may both be directly formed on the respective transistors 100p, 100n without any intermediate etch stop layers 120, 121. Consequently, a high degree of design flexibility is provided without requiring epitaxial growth techniques, wherein the type and magnitude of the stress transferred into the respective channel regions may be readily controlled on the basis of the stress provided in the respective contact etch stop layers.

With reference to FIGS. 2a-2h, further illustrative embodiments of the present invention will now be described in more detail, in which a strained semiconductor material is positioned in close proximity to the channel region by means of a disposable spacer, thereby enabling an efficient combination of the two strain-inducing mechanisms, i.e., providing strained semiconductor material close to the channel and using a recessed transistor configuration, similar to embodiments previously described with reference to FIGS. 1a-1i.

Figure 2A:
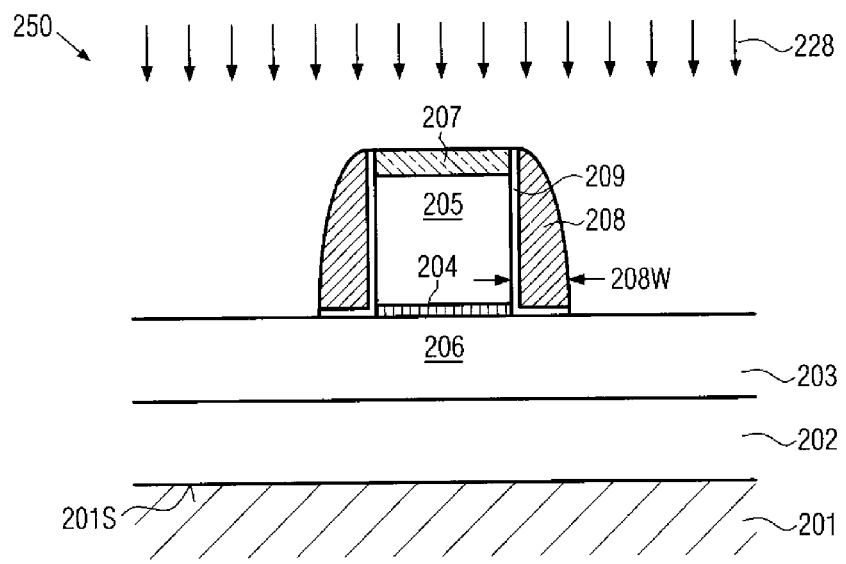
FIGS. 2a-2d schematically illustrate cross-sectional views of a transistor device during the formation of an embedded strained semiconductor material having an increased offset to a metal silicide according to illustrative embodiments of the present invention.
Figure 2B:
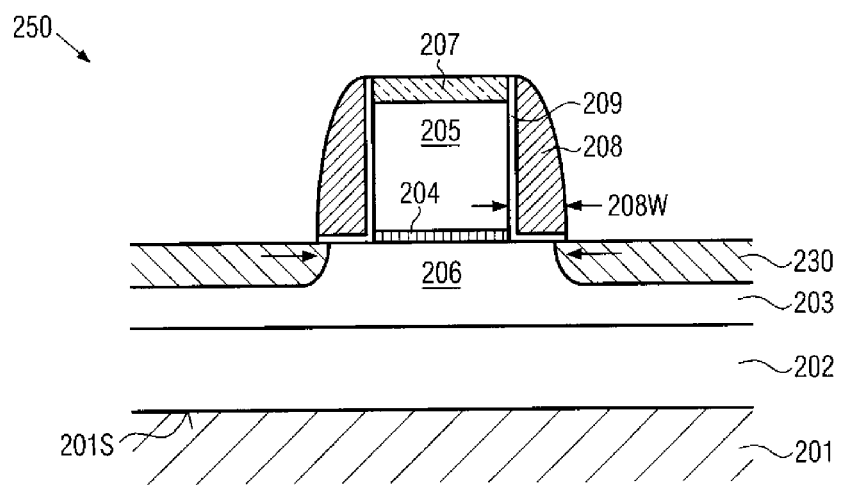
Figure 2C:
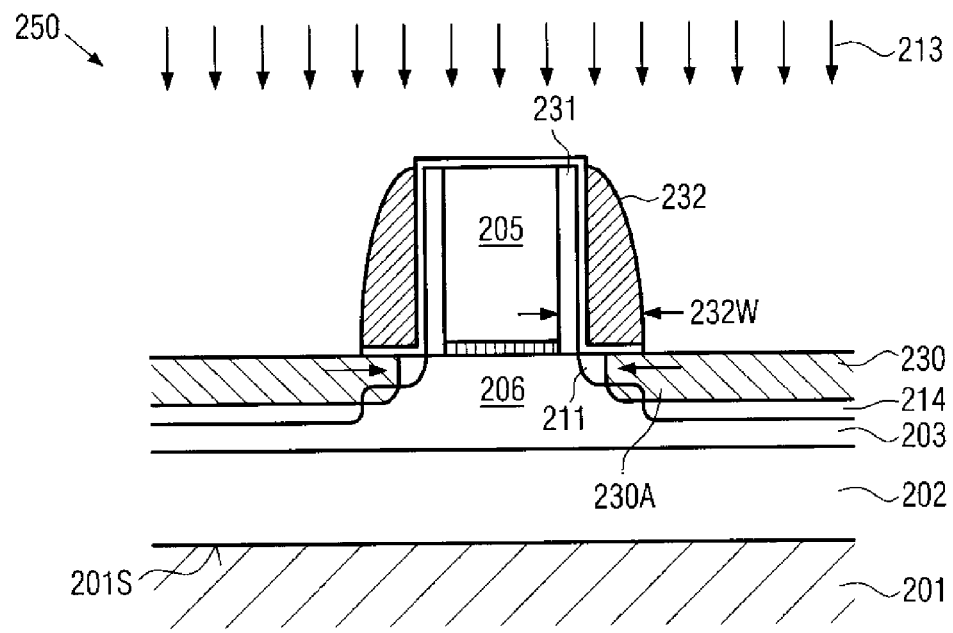
Figure 2D:
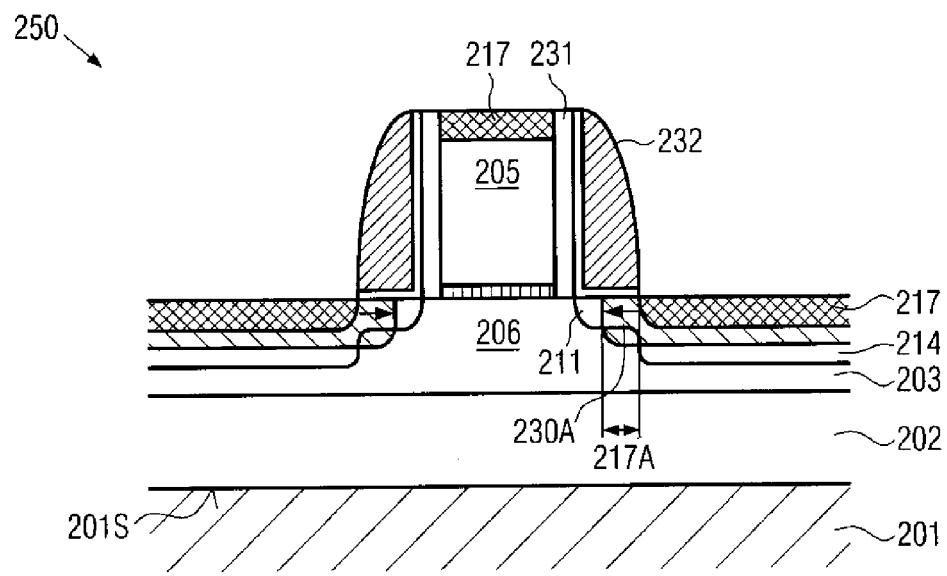
Figure 2E:
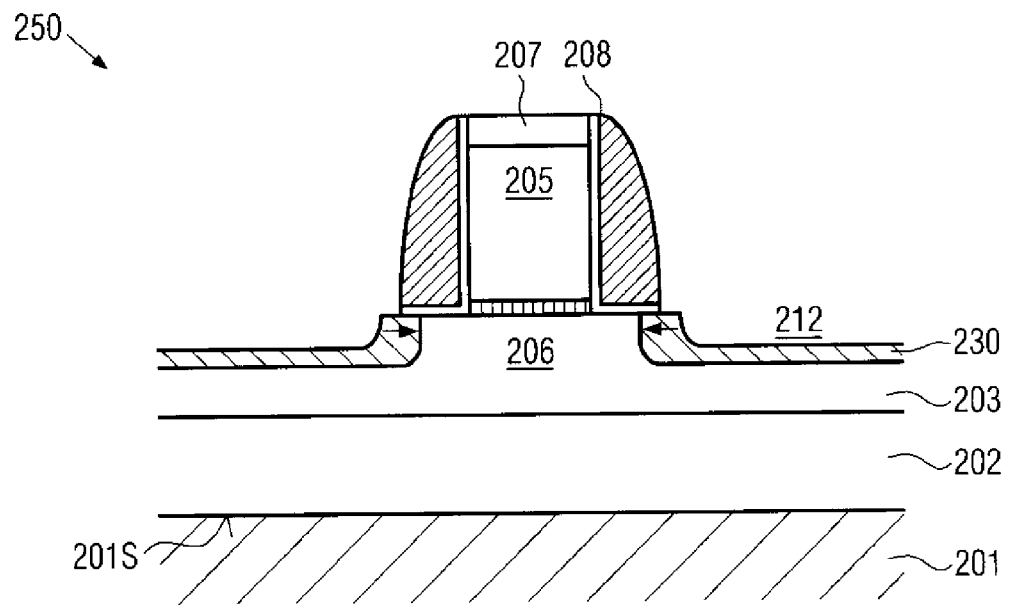
FIGS. 2e-2g schematically illustrate cross-sectional views of a transistor element having an embedded strained semiconductor material and recessed drain and source regions for enhancing the stress transfer from an overlaying layer.
Figure 2F:
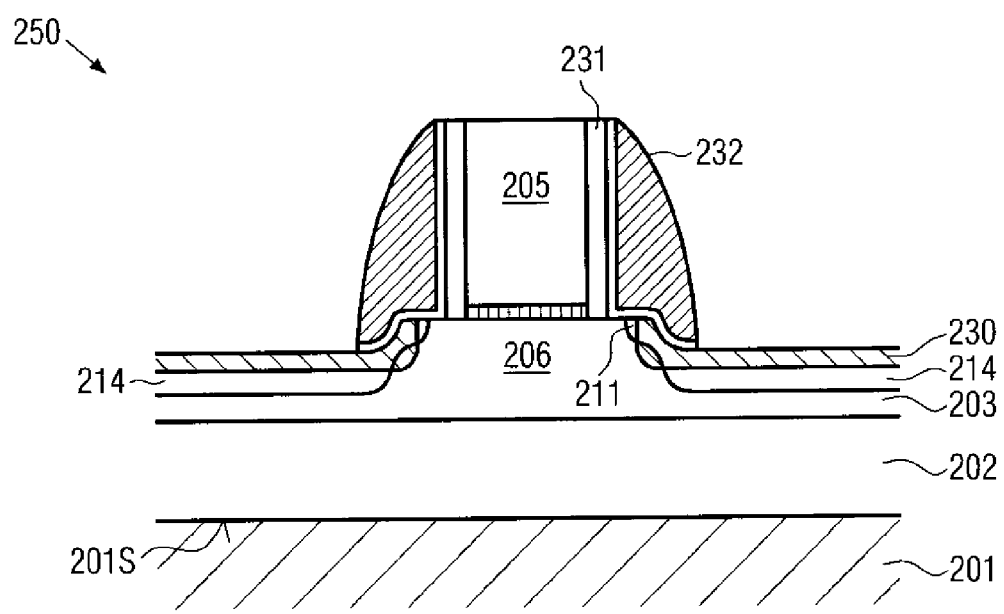
Figure 2G:
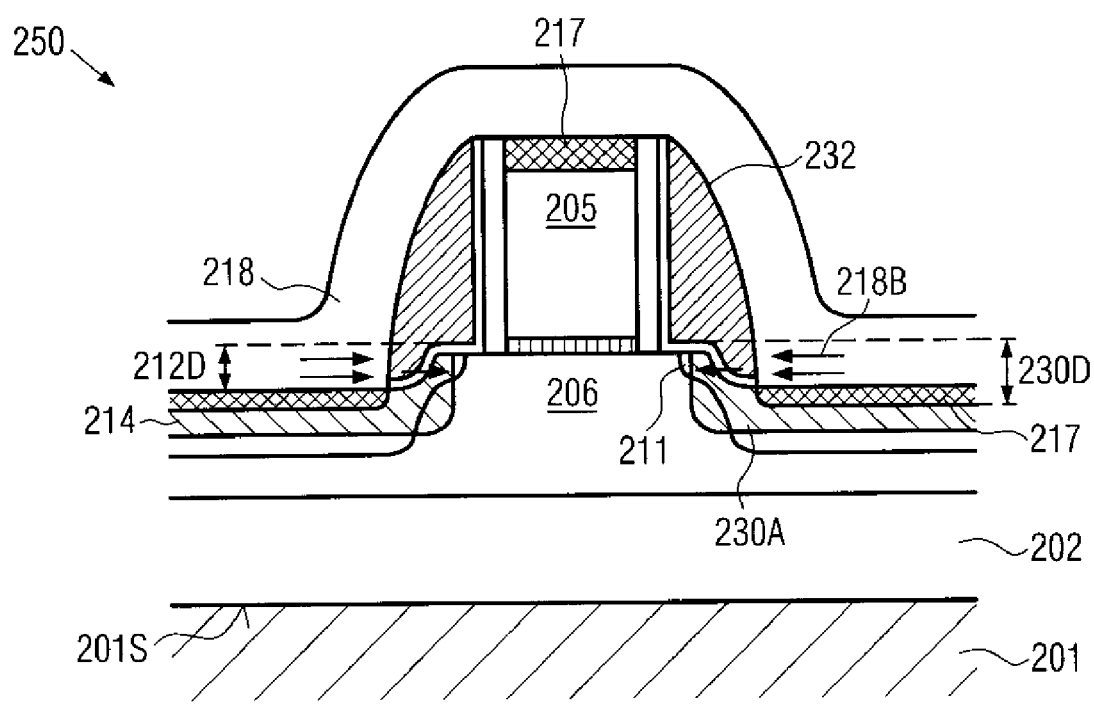

With reference to FIGS. 2a-2d, the concept of the disposable spacer approach is described for a substantially flush configuration and, with reference to FIGS. 2e-2g, the combination with the recessed transistor configuration is described.

In FIG. 2a, a semiconductor device 250 may comprise a transistor 200, which may have a similar configuration as the transistor 100 in FIG. 1a, except for the extension regions 111. Thus, the transistor 200 may comprise a gate electrode 205 that is formed above a semiconductor layer 203 provided above a substrate 201, wherein the gate electrode 205 is separated from the semiconductor layer 203 by a gate insulation layer 204. Moreover, the gate electrode 205 may be encapsulated by a capping layer 207 and spacers 208, possibly in combination with a liner 209. Regarding a process flow for manufacturing the semiconductor device 250, substantially the same processes may be involved as previously described with reference to the device 150 in FIG. 1a. Moreover, the device 250 may be subjected to an etch process 228 for forming a recess adjacent to the gate electrode 205 with an offset therefrom corresponding to a width 208W of the spacer 208 and the characteristics of the etch process 228, as is also described above with reference to the etch process 128. That is, the process 228 may be designed as an anisotropic or isotropic etch process for recessing the semiconductor layer 203 adjacent to the gate electrode 205 with a specified depth in order to form in the respective recess a strained semiconductor material, which may then provide a desired strain in a channel region 206 of the transistor 200. A corresponding strained semiconductor material may be formed on the basis of well-established selective epitaxial growth techniques, in which the remaining crystalline material of the layer 203, after being recessed by the etch process 228, is used as a growth template in order to re-grow the strained semiconductor material, which is selected to have in its natural or unstrained state a slightly different lattice spacing compared to the template material of the remaining semiconductor layer 203. For instance, silicon/germanium or silicon/carbon are crystalline semiconductor compounds which when grown on a substantially undisturbed silicon lattice may form a strained semiconductor material due to a respective slight mismatch in lattice spacing. That is, a silicon/germanium material grown on a substantially undisturbed silicon lattice may form a compressively strained lattice due to a slightly greater lattice spacing of non-strained silicon/germanium with respect to silicon. Similarly, silicon/carbon grown on silicon may form a semiconductor material of tensile strain.

FIG. 2b schematically illustrates the device 250 according to one illustrative embodiment in which, after the completion of the etch process 228 and any pre-epitaxial processes, such as clean processes and the like, a strained semiconductor material 230 is formed in the corresponding recess, wherein, in this embodiment, the strained semiconductor material 230 may be formed so as to substantially completely fill the corresponding recess without requiring an over growth to provide excess material for a subsequent silicidation process. In other embodiments, as will be described later on, after the selective epitaxial growth process, a certain degree of underfill may be maintained. In the illustrative example shown, a silicon/germanium semiconductor material 230 may have been formed to provide a respective compressive strain. Thereafter, the spacer 208 having the width 208W that, in combination with the process parameters of the etch process 228, substantially determines an offset of the strained semiconductor material 230 with respect to the gate electrode 205 may be removed on the basis of well-established selective etch recipes. Thereby, the capping layer 207 may also be removed. After the removal of the spacer 208, a corresponding spacer regime may be used in order to provide the required lateral and vertical dopant profile in the semiconductor layer 203, thereby forming respective extension regions and drain and source regions.

FIG. 2c schematically illustrates the semiconductor device 250 during a corresponding process sequence, wherein an offset spacer 231 may be used for defining an extension region 211, while one or more final spacers 232 may be used as an implantation mask during an ion implantation process 213 for forming drain and source regions 214. The spacer 232 in combination with the spacer 231 has a width 232W that is greater than the corresponding width 208W, wherein it should be appreciated that the width 232W may include the width of the offset spacer 231. Since the spacer 232 may also be used for further manufacturing processes, such as a subsequent silicidation process, the increased width 232W provides a respective offset between a metal silicide region to be formed within the strained semiconductor material 230 and a portion 230A of the material 230 located next to the channel region 206.

FIG. 2d schematically illustrates the semiconductor device 250 with correspondingly formed metal silicide regions 217, wherein the corresponding offset 217A of the metal silicide regions 217 in the strained semiconductor material 230A of the drain and source regions 214 is provided, thereby laterally positioning a strained semiconductor material between the substantially relaxed metal silicide region 217 and the channel region 206. Consequently, contrary to conventional strategies in which the spacers of the width 232W may also be used for forming the strained semiconductor material 230, i.e., for forming a respective cavity which would then be substantially completely consumed by the silicidation process, corresponding to the illustrative embodiments as shown in FIG. 2d, a significant portion of strained semiconductor material, i.e., the portion 230A, is still provided next to the channel region 206 at a height that substantially corresponds to the interface between the gate insulation layer 204 and the channel region 206. As a consequence, compared to conventional strategies, a more efficient strain transfer may occur, thereby also resulting in a correspondingly enhanced performance of the transistor 200. Thereafter, the further processing may be continued by forming a respective contact etch stop layer, such as the layer 118 (FIG. 1e), wherein, in some illustrative embodiments, the corresponding etch stop layer may be provided with an appropriate intrinsic stress in order to even more enhance the strain created in the channel region 206.

FIG. 2e schematically illustrates the semiconductor device 250 in accordance with yet other illustrative embodiments in which, after the completion of the process sequence as described with reference to FIG. 2a, i.e., after a corresponding cavity etch and selective epitaxial growth process, a recess 212 is still provided adjacent to the gate electrode 205. That is, the epitaxial growth process may be stopped at a height level that is below the level defined by the gate insulation layer 204. For example, the recess 212 may have a depth of approximately 1-20 nm, when the material 230 is formed down to a depth of approximately 30-40 nm. Thus, by not completely filling the previously formed cavity during the epitaxial growth process, the process time may be reduced, in addition to providing further enhancement of the strain-inducing mechanism.

In other cases, the device 250 as shown in FIG. 2b may be subjected to a further etch process for removing strained semiconductor material in order to provide the recess 212 when a control of the selective epitaxial growth process may not result in the desired process uniformity. Thereafter, the spacer 208 may be removed and further processing may be performed on the basis of device spacers, such as the spacers 231 and 232, having the increased spacer width 232W in order to form the drain and source regions 214 and the extensions 211.

FIG. 2f schematically illustrates the device 250 after completion of the above-described processes.

FIG. 2g schematically illustrates the device 250 in a further advanced manufacturing stage. The transistor 200 may comprise metal silicide regions 217 which may be formed on the basis of the spacer 232, as is also described above with reference to FIG. 2d. Consequently, a certain amount of non-silicided strained semiconductor material 230A is provided between the metal silicide region 217 and the channel region 206 due to the offset provided by the increased spacer width 232W compared to the spacer width 208W used for forming the respective strained semiconductor material 230. It should be appreciated that the formation of the metal silicide regions 217 in the gate electrode 205 and the drain and source regions 214 may be performed in a common process, as shown in FIG. 2g, or may be performed in a more independent manner, as is for instance described with reference to FIG. 1h or in accordance with any other appropriate regime. Moreover, the device 250 comprises a stressed contact etch stop layer 218, which may comprise any appropriate intrinsic stress so as to further enhance the strain in the channel region 206. In the embodiment shown in FIG. 2g, the layer 218 may be provided with high compressive stress in order to enhance the strain created by the respective silicon/germanium material 230. In other embodiments, the strained semiconductor material 230 may be comprised of silicon and carbon, thereby inducing a tensile strain in the channel region 206. In this case, the contact etch stop layer 218 may be provided with high intrinsic tensile stress, which may be accomplished on the basis of appropriately selected deposition parameters, as is previously described. Similarly, as described above, the recess 212 may provide further enhanced stress transfer into the channel region 206, since a significant portion of the layer 218 is formed within the recess 212, thereby providing direct "pushing" 218B or "drawing," depending on the type of stress, with respect to the channel region 206. In this way, the strain of the non-silicided portion 230A may be combined with the additional direct stress 218B, thereby resulting in a corresponding high strain in the channel region 206. For example, for a depth 212D of the recess 212 of approximately 1-20 nm and a depth 230D of the strained semiconductor material 230 in the range of approximately 30-50 nm, a significant increase of the strain in the channel region 206 may be observed.

Figure 2H:
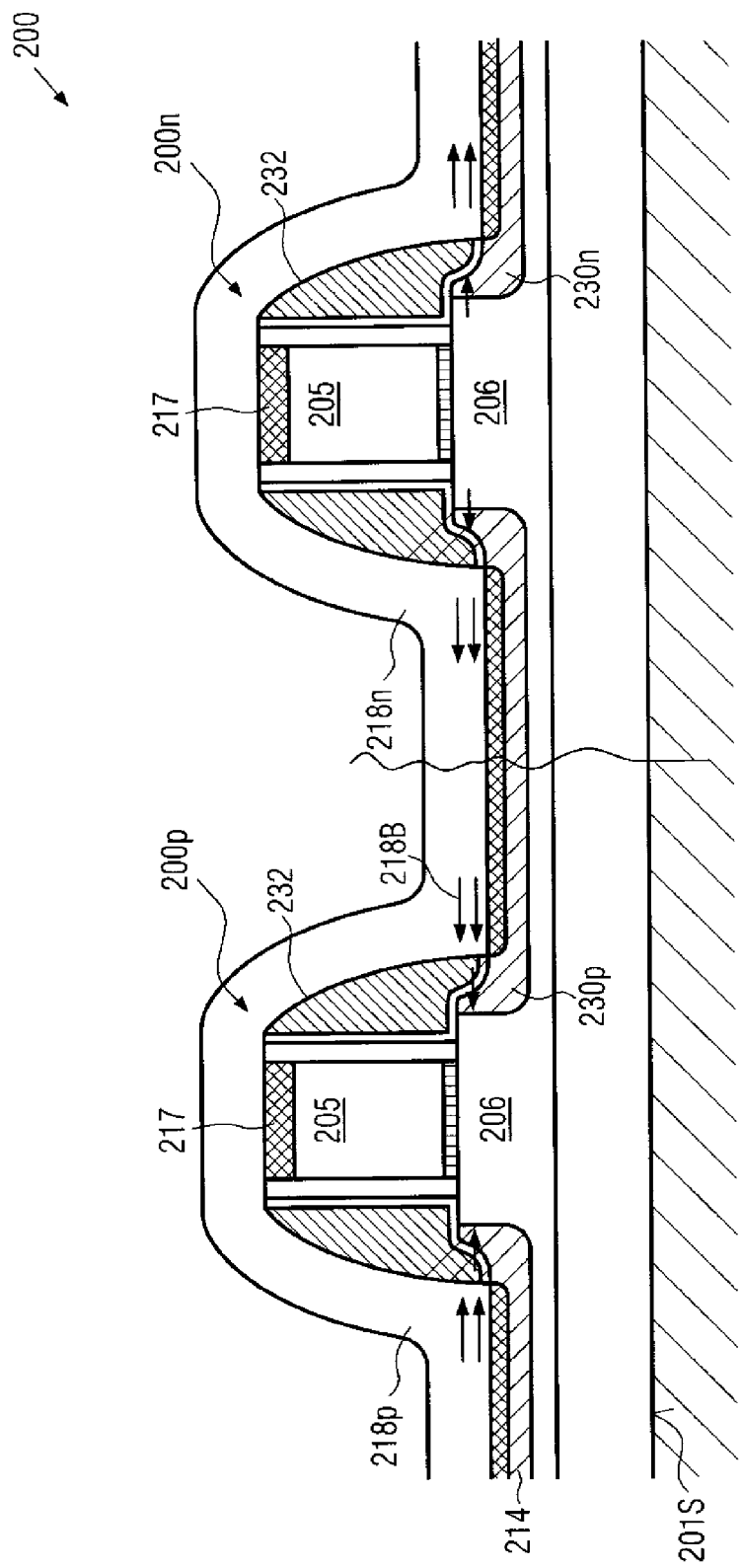
FIG. 2h schematically illustrates in cross-sectional view a semiconductor device having two different types of transistors, each having a strained semiconductor material in combination with a recessed drain/source architecture according to still other illustrative embodiments of the present invention.

FIG. 2h schematically illustrates the semiconductor device 250 according to further illustrative embodiments in which the device 250 comprises a first transistor 200p and a second transistor 200n of different conductivity types. For example, the transistor 200p may represent a P-channel transistor and the transistor 200n may represent an N-channel transistor. Regarding the configuration of the transistors 200p, 200n, the same criteria may apply as previously explained with reference to the transistor 200, wherein, however, the corresponding profiles and concentrations in the channel regions 206 and the drain and source regions (not shown for clarity) may be selected so as to correspond to the respective conductivity type. Therefore, the first transistor 200p may have formed thereabove a first contact etch stop layer 218p, which extends into the corresponding recess 212 in order to further enhance the strain created by the strained semiconductor material 230p. Similarly, the second transistor 200n comprises a second contact etch stop layer 218n having a different type of internal stress so as to correspondingly increase a strain in the respective channel region provided by the strained semiconductor material 230n. With respect to the formation of the first and second contact etch stop layers 218p and 218n, the same criteria apply as previously explained with respect to the corresponding layers 118p, 118n. As a consequence, two strain-inducing sources, i.e., a strained semiconductor material and a stressed overlaying layer, may be efficiently combined for different types of transistors by at least positioning the strained semiconductor material more closely to the gate electrode, wherein, in some illustrative embodiments, additionally a recessed transistor configuration may be provided in order to even more enhance the stress transfer mechanism for the respectively stressed contact etch stop layers.

As a result, the present invention provides an enhanced technique for the manufacturing of transistor elements having formed therein one or more strain-inducing sources, the efficiency of which is significantly increased by positioning the respective strain-inducing source more closely to the channel region of the respective transistor element. In one aspect, this may be accomplished by recessing the drain and source regions and forming a stressed layer in the recess, such as a stressed contact etch stop layer, which may now generate the strain in the channel region more directly. In other aspects, strained semiconductor material may be positioned more closely to the channel region, wherein deleterious strain relaxing effects from metal silicides may be reduced or substantially avoided. Consequently, increased efficiency in providing strain in the channel region may be achieved. Furthermore, the different techniques may be advantageously combined so as to enhance the strain-inducing mechanism provided by a strained semiconductor material in combination with an enhanced efficiency of an overlaying stressed layer by forming the same in a recessed drain and source region. Since one or more of the preceding techniques may be readily applied to different transistor types, a high degree of flexibility in individually improving the performance of these transistors may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   a first transistor of a first conductivity type, said first transistor comprising:
   a first gate electrode formed above a first channel region;
   a first gate insulation layer formed between said first gate electrode and said first channel region;
   first drain and source regions formed adjacent to said first channel region, said first drain and source regions having a top surface immediately adjacent said first channel region that is recessed with respect to a bottom surface of said first gate insulation layer, wherein said first recessed drain and source regions comprise an embedded first strained semiconductor material; and
   a first stressed layer formed above said first drain and source regions, said first stressed layer extending into a recess formed by said first recessed drain and source regions.

2. The semiconductor device of claim 1, further comprising:
   a second transistor of a second conductivity type other than said first conductivity type, said second transistor comprising:
   a second gate electrode formed above a second channel region;
   a second gate insulation layer formed between said second gate electrode and said second channel region;

second drain and source regions formed adjacent to said second channel region, said second drain and source regions having a top surface immediately adjacent said second channel region that is recessed with respect to a bottom surface of said second gate insulation layer, wherein said second recessed drain and source regions comprise an embedded second strained semiconductor material; and a second stressed layer formed above said second drain and source regions, said second stressed layer extending into a recess formed by said second recessed drain and source regions.

3. The semiconductor device of claim 2, wherein said embedded second strained semiconductor material is different than said embedded first semiconductor material.

4. The semiconductor device of claim 2, wherein said first stressed layer comprises a material other than a material of said second stressed layer.

5. The semiconductor device of claim 1, wherein said first stressed layer is a portion of a dielectric contact layer formed above said first transistor.

6. The semiconductor device of claim 5, wherein said first stressed layer represents a first contact etch stop layer.

7. The semiconductor device of claim 1, wherein said first transistor represents a P-channel transistor and said first stressed layer comprises a compressive stress.

8. The semiconductor device of claim 1, wherein said embedded first strained semiconductor material comprises one of strained silicon/germanium and strained silicon/carbon.

9. The semiconductor device of claim 1, further comprising a sidewall spacer formed on a sidewall of said first gate electrode and a metal silicide formed in said first drain and source region adjacent to said sidewall spacer.

10. The semiconductor device of claim 9, wherein a portion of said embedded first strained semiconductor material is formed below said sidewall spacer to be located laterally between said metal silicide and said first channel region.

11. The semiconductor device of claim 1, wherein a depth of said recess is approximately 30-200 nm.

* * * * *